(12) United States Patent
Gendron et al.

(10) Patent No.: US 8,193,560 B2
(45) Date of Patent: Jun. 5, 2012

(54) VOLTAGE LIMITING DEVICES

(75) Inventors: Amaury Gendron, Scottsdale, AZ (US);
Chai Ean Gill, Chandler, AZ (US);
Rouying Zhan, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 227 days.

(21) Appl. No.: 12/487,031

(22) Filed: Jun. 18, 2009

(65) Prior Publication Data
US 2010/0320501 A1 Dec. 23, 2010

(51) Int. Cl.
*H01L 29/66* (2006.01)
(52) U.S. Cl. ......... 257/173; 257/355; 257/356; 257/357
(58) Field of Classification Search .................. 257/173
See application file for complete search history.

(56) References Cited

U.S. PATENT DOCUMENTS

| | | | |
|---|---|---|---|
| 6,759,691 B2 * | 7/2004 | Chen ............................ | 257/107 |
| 6,879,476 B2 | 4/2005 | Khazhinsky et al. | |
| 7,023,029 B1 * | 4/2006 | Vashchenko et al. ......... | 257/173 |
| 7,202,114 B2 * | 4/2007 | Salcedo et al. ................ | 438/133 |
| 7,243,317 B2 * | 7/2007 | Wang et al. .................... | 716/112 |
| 7,479,414 B2 * | 1/2009 | Salcedo et al. ................ | 438/133 |
| 7,566,914 B2 * | 7/2009 | Salcedo et al. ................ | 257/127 |
| 7,701,012 B2 * | 4/2010 | Xu et al. ........................ | 257/355 |
| 7,868,387 B2 * | 1/2011 | Salcedo et al. ................ | 257/362 |
| 7,888,703 B2 * | 2/2011 | Albers et al. .................. | 257/173 |
| 7,911,749 B2 * | 3/2011 | Lai .................................. | 361/56 |
| 7,919,817 B2 * | 4/2011 | Mallikarjunaswamy ..... | 257/355 |
| 2001/0043449 A1 | 11/2001 | Okushima | |
| 2002/0020880 A1 * | 2/2002 | Yu ................................ | 257/360 |
| 2003/0052332 A1 * | 3/2003 | Chen ............................ | 257/173 |
| 2003/0179523 A1 * | 9/2003 | Kodama ........................ | 361/56 |
| 2005/0151160 A1 * | 7/2005 | Salcedo et al. ................ | 257/173 |
| 2005/0207077 A1 | 9/2005 | Xu et al. | |
| 2006/0151836 A1 * | 7/2006 | Salcedo et al. ................ | 257/362 |
| 2007/0228412 A1 | 10/2007 | Yang et al. | |
| 2008/0012044 A1 * | 1/2008 | Salcedo et al. ................ | 257/173 |
| 2008/0044955 A1 | 2/2008 | Salcedo et al. | |
| 2008/0088994 A1 * | 4/2008 | Lai ................................. | 361/56 |
| 2008/0218922 A1 * | 9/2008 | Mallikarjunaswamy et al. ............................ | 361/91.6 |
| 2009/0212323 A1 * | 8/2009 | Liu et al. ....................... | 257/173 |
| 2009/0213506 A1 * | 8/2009 | Zhan et al. ..................... | 361/56 |
| 2009/0268361 A1 * | 10/2009 | Mallikarjunaswamy ....... | 361/56 |
| 2010/0172059 A1 * | 7/2010 | Chaine et al. .................. | 361/56 |

OTHER PUBLICATIONS

PCT Application No. PCT/US2010/035388; Search Report and Written Opinion dated Dec. 31, 2010.
Feng, H.,et al., RC-SCR: very-low-voltage ESD protection circuit in plain CMOS Electronics Letters, vol. 38, Sep. 12, 2002.

* cited by examiner

*Primary Examiner* — Eugene Lee
*Assistant Examiner* — Mohammed Shamsuzzaman
(74) *Attorney, Agent, or Firm* — Sherry W. Schumm (57) ABSTRACT

An electrostatic discharge (ESD) protection device coupled across input-output (I/O) and common terminals of a core circuit, comprises first and second merged bipolar transistors. A base of the first transistor serves as collector of the second transistor and the base of the second transistor serves as collector of the first transistor, the bases having, respectively, first width and second width. A first resistance is coupled between an emitter and base of the first transistor and a second resistance is coupled between an emitter and base of the second transistor. ESD trigger voltage Vtl and holding voltage Vh can be independently optimized by choosing appropriate base widths and resistances. By increasing Vh to approximately equal Vtl, the ESD protection is more robust, especially for applications with narrow design windows, for example, with operating voltage close to the degradation voltage.

16 Claims, 8 Drawing Sheets

FIG. 3
- PRIOR ART -
ESD CLAMP 21

FIG. 4

FIG. 5    ESD CLAMP 60

FIG. 6    ESD CLAMP 80

210    FIG. 10    ESD CLAMP  80    310

211    FIG. 11    ESD CLAMP  80    311

212    FIG. 12    ESD CLAMP  80    312

VOLTAGE LIMITING DEVICES

FIELD OF THE INVENTION

The present invention generally relates to electrostatic discharge (ESD) protection of electronic elements and, more particularly, ESD protection of semiconductor components and integrated circuits.

BACKGROUND OF THE INVENTION

Modern electronic devices, especially semiconductor (SC) devices and integrated circuits (ICs) are at risk of damage due to electrostatic discharge (ESD) events. It is well known that electrostatic discharge from handling SC devices and ICs, by humans or machines or both, is a source of such excess voltage. Accordingly, it is commonplace to provide an ESD clamp (voltage limiting device) across the input/output (I/O) and other terminals of such SC devices and IC's.

Figure 1:
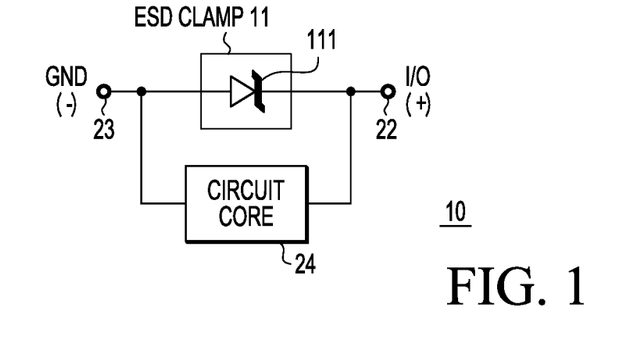
FIG. 1 is a simplified electrical schematic diagram of a generalized ESD protection circuit using an ESD clamp to protect a circuit core from electrostatic discharge (ESD) events.

FIG. 1 is a simplified schematic diagram of circuit 10 wherein ESD clamp 11 is placed between input/output (I/O) terminals 22 and ground or common terminal 23 of a SC device or IC to protect the other devices on the chip, that is, to protect circuit core 24 which is also coupled to I/O terminals 22 and common (e.g., "GND") terminal 23. Zener diode symbol 111 within ESD clamp 11 indicates that the function of ESD clamp 11 is to limit the voltage than can appear across circuit core 24 irrespective of the voltage applied to external I/O and GND terminals 22, 23. It is not intended to imply that a Zener diode is actually employed in ESD clamp 11. As used herein, the abbreviation "GND" is intended to refer to the common or reference terminal of a particular circuit or electronic element, irrespective of whether it is actually coupled to an earth return and the abbreviation "I/O" is intended to include any external terminal other than "GND".

Figure 2:
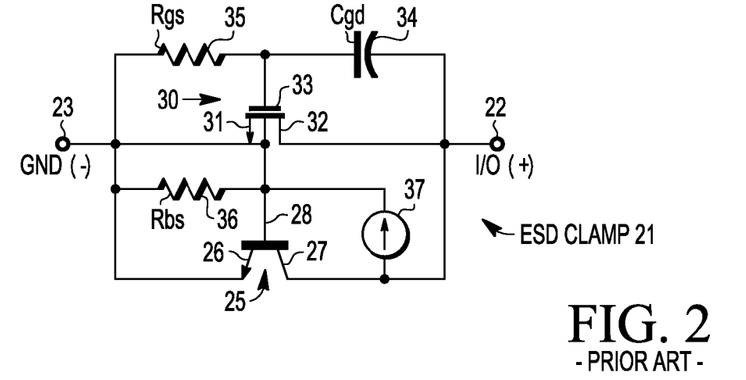
FIG. 2 is a simplified electrical schematic diagram illustrating internal components of a prior art ESD clamp.
Figure 3:
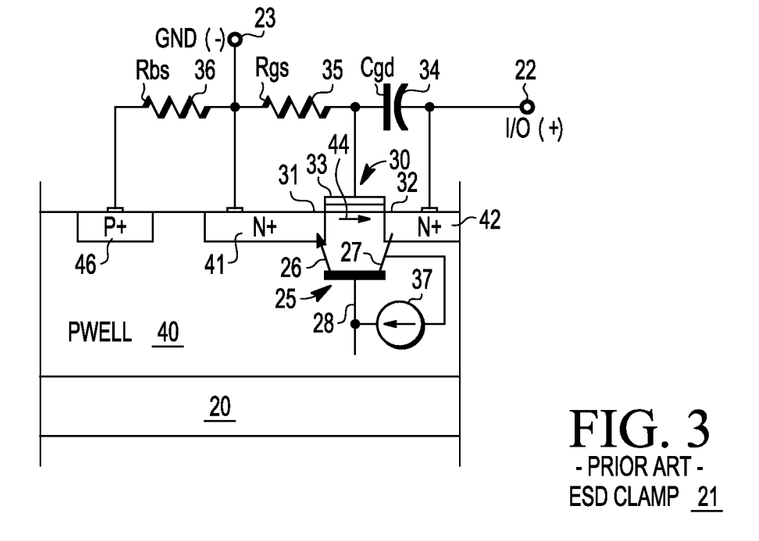
FIG. 3 is a simplified combined electrical schematic and cross-sectional view of the ESD clamp of FIG. 2 implemented in a semiconductor substrate according to the prior art.
Figure 4:
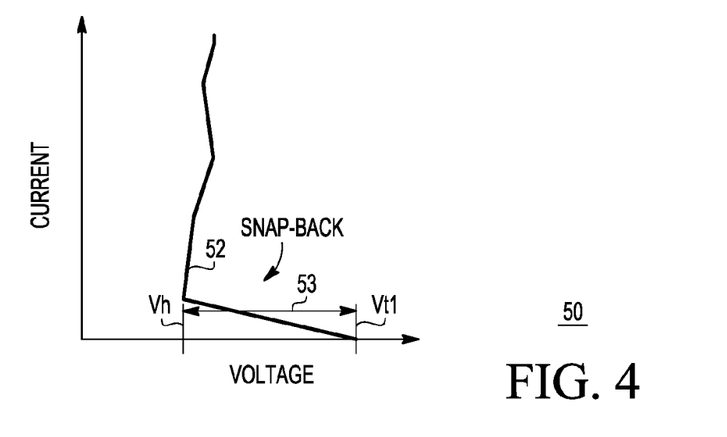
FIG. 4 is an illustration of a typical current-voltage characteristic of the ESD clamp of FIGS. 2 and 3.

FIG. 2 is a simplified schematic diagram illustrating internal components of prior art gate-coupled N-channel metal-oxide-semiconductor (NMOS) ESD clamp 21 that is inserted in circuit 10 in place of ESD clamp 11 and FIG. 3 is a simplified combined schematic and cross-sectional view through clamp 21 as typically implemented in semiconductor substrate 20. ESD clamp 21 comprises parasitic NPN lateral bipolar transistor 25, having emitter 26, collector 27 and base 28, and NMOS transistor 30 with source 31, drain 32 and gate 33. Parasitic gate-drain capacitance Cgd 34, gate-source resistor 35 and bulk-source resistor Rbs 36 are also shown. Avalanche current source 37 is effectively coupled between collector 27 and base 28 of bipolar transistor 25. As shown in FIG. 3, semiconductor substrate 20 comprises PWELL 40 wherein N+ region 41 therein acts as source 31 and parasitic emitter 26, and N+ region 42 therein acts as drain 32 and parasitic collector 27. Avalanche current source 37 is coupled between collector region 27, 42 and base 28 of bipolar transistor 25 provided by PWELL 40. Channel region 44 of PWELL 40 contains the channel of NMOS 30. P+ contact region 46 is coupled via PWELL 40 to base 28 of parasitic bipolar transistor 25 and the body of NMOS transistor 30 in which channel region 44 conducts under appropriate bias. When an ESD transient appears between I/O 22 and GND 23, ESD clamp 21 turns on to harmlessly divert the ESD transient. FIG. 4 illustrates current-voltage plot 50 of an ESD clamp, wherein trace 52 shows the general behavior of typical prior art ESD clamp 21. When a positive voltage is applied between I/O 22 and GND 23, negligible current flows until "trigger voltage" Vt1 is reached, whereupon ESD clamp 21 turns on. Once current begins to flow, the voltage between I/O 22 and GND 23 drops to what is called the "holding voltage" Vh, generally substantially less than trigger voltage Vt1 and the current rises rapidly to whatever saturation value is determined, for example, by the internal impedance of the ESD voltage source. The voltage difference between Vt1 and Vh is referred to as the "snap-back", indicated by voltage difference 53.

While prior art ESD clamps such as ESD clamp 21, can perform the above-described protection function well, they can also suffer from a number of undesirable limitations. A particularly serious difficulty can rise when such ESD protection elements are used in SC devices and ICs fabricated with deep submicron manufacturing processes often associated with very high speed digital and analog applications. With such manufacturing processes, the threshold voltage of NMOS device 30 may be very low, for example, ~0.3 volts or less, while I/O 22 to which it is coupled may experience non-ESD operating signals as high as, for example, a volt or more. These operating signals can be significantly larger than the threshold voltage of device 30 but much less than voltages of concern from ESD events. Ordinarily, ESD clamp 21 should ignore such (non-ESD) operating signals appearing at I/O 22. These (non-ESD) operating signal appearing at I/O 22 can be coupled to gate 33 via parasitic gate-drain capacitance Cgd. For low operating speeds (e.g., low dv/dt), this causes no significant rise in gate voltage unless the much larger voltage associated with an ESD event is experienced, in which case the ESD clamp behaves as intended. However, as the operating speed of the associated devices or ICs rises, the increased dv/dt of the ordinary (non-ESD) signal appearing on I/O 22 can cause the voltage appearing on gate 33 to rise above the threshold voltage, causing ESD clamp 20 to turn ON in response to the rapid I/O signal condition rather than an ESD event. Under these circumstances ESD clamp 21 may shunt, for example, 20-30 milliamps of current, resulting in significantly increased power consumption for no useful purpose.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or manufacture in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

While the arrangements of FIGS. 2 and 3 can be effective in providing ESD protection, further improvements are desirable. As noted above, there is an ongoing need to provide improved ESD clamps, especially ESD clamps that are immune to rapid signal transients, especially in high speed devices and ICs fabricated in deep sub-micron technologies. Other desirable features and characteristics of the present invention will become apparent from the subsequent detailed description of the invention and the appended claims, taken in conjunction with the accompanying drawings and this description of the invention. For convenience of explanation, various embodiment of the ESD clamps of the present invention are described for particular combinations of N and P type doping providing, for example, NPN bipolar transistors and PNP bipolar transistors, but persons of skill in the art will understand that this is not intended to be limiting and that opposite types of devices may be provided by interchanging the doping types, wherein a PWELL is substituted for an NWELL, a P type buried layer (PBL) for an N type buried layer (NBL), a P+ contact, source, drain, emitter or collector for an N+ contact, source, drain, emitter or collector, and vice-versa. Thus, the identification of various regions as being either P or N type is merely for convenience of description and that, more generally, such regions may be identified as being of a first conductivity type that is either P or N type or of a second, opposite, conductivity type that is accordingly N or P type.

Figure 5:
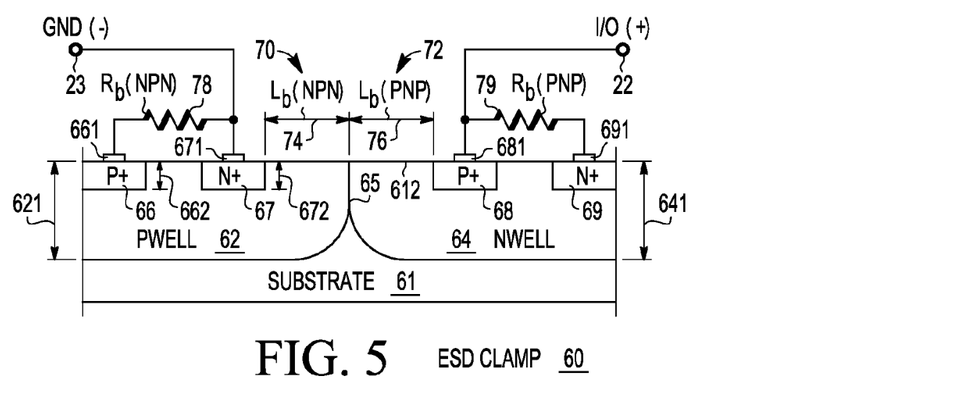
FIG. 5 is a simplified combined electrical schematic and cross-sectional and schematic view illustrating internal components of a general ESD clamp according to an embodiment of the present invention.

It has been found, that the false ESD clamp turn-on associated with fast operating signal events appearing on I/O 22 can be avoided by using ESD protection based on bipolar transistors instead of MOS transistors. Furthermore, for reliability purpose, it is highly desirable to separately optimize the trigger voltage Vt1 and the holding voltage Vh, so that the trigger voltage Vt1 can be lower than the degradation (ESD transient) voltage of the core circuit and the holding voltage can be higher than the operating voltage of the core circuit. Ideally, when the operating voltage and the degradation voltage are close, the ESD protection should have as little snapback as possible, that is, it is desirable to have Vh~Vt1. FIG. 5 is a simplified combined cross-sectional and electrical schematic diagram illustrating generalized ESD clamp 60 according to an embodiment of the present invention. Clamp 60 comprises substrate 61 having upper surface 612, PWELL 62 of depth 621 from surface 612 and abutting or proximate NWELL 64 of depth 641 from surface 612 and with PN junction 65 therebetween. Substrate 61 may be either N or P type or comprise a dielectric with semiconductor 61 thereon, as for example and not intended to be limiting, in a semiconductor-on-insulator (SOI) structure. In various other embodiments, the conductivity types of wells 62, 64 of FIG. 5 and wells 82, 84 of FIG. 6 may be interchanged and as used herein the designation "PN" referring, for example, to junction 65 and other junctions is intended to include such variations. Located in PWELL 62 is P+ region 66 and N+ region 67 extending from surface 612. Located in NWELL 64 is P+ region 68 and N+ region 69 extending from surface 612. P+ regions 66, 68 have depth 662 from surface 612 and N+ regions 67, 69 have depth 672 from surface 612. Doped regions 66, 67, 68, 69 have conductive (e.g., metal or silicide) contacts 661, 671, 681, 691 respectively. N+ (emitter) region 67, PWELL (base) 62 with P+ base contact region 66 and NWELL (collector) 64 with N+ collector contact region 69 form lateral NPN transistor 70 with lateral base width $L_b(NPN)$ 74. P+ (emitter) region 68, NWELL (base) 64 with N+ base contact region 69 and PWELL (collector) 62 with P+ collector contact region 66 form lateral PNP transistor 72 with lateral base width $L_b(PNP)$ 76. Base resistor $R_b(NPN)$ 78 is coupled between contact 671 of N+ emitter region 67 and contact 661 of P+ base contact region 66 of lateral NPN transistor 70. Base resistor $R_b(PNP)$ 79 is coupled between contact 681 of P+ emitter region 68 and contact 691 of N+ base contact region 69 of lateral PNP transistor 72. It has been found that by suitably adjusting base resistors 78, 79 and base widths 74, 76, that Vt1 and Vh can be separately controlled. In particular Vt1 can be reduced and Vh can be increased, so that Vh and Vt1 are close or substantially equal, so that ESD clamp 60 operates very reliably.

Figure 6:
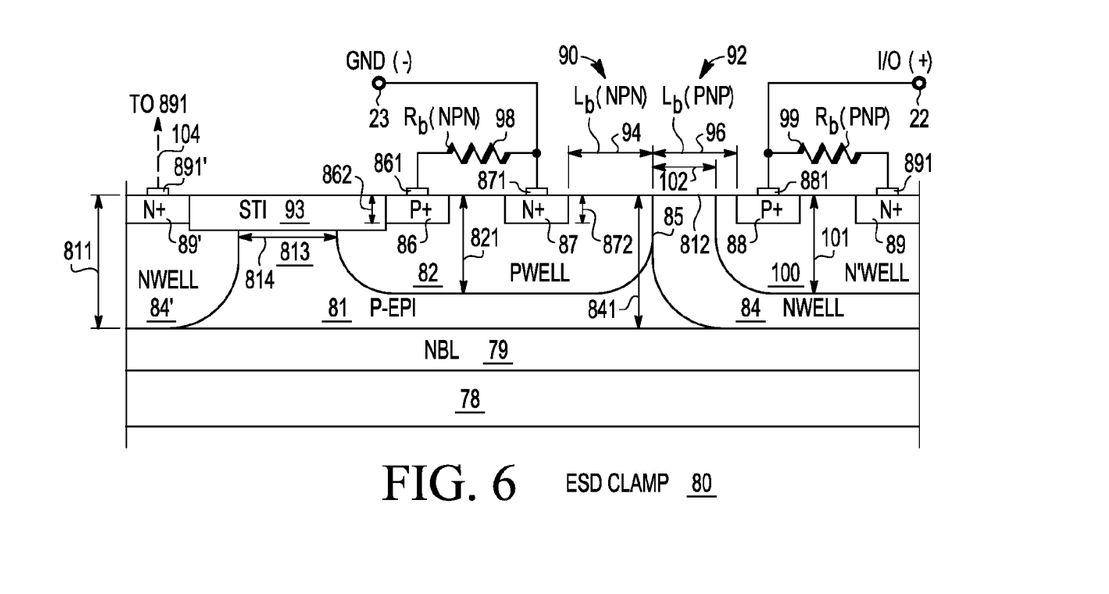
FIG. 6 is a simplified combined electrical schematic and cross-section view similar to that of FIG. 5 of an ESD clamp according to a further embodiment of the present invention and showing additional details.

FIG. 6 is a simplified combined cross-section and electrical schematic diagram similar to FIG. 5 of ESD clamp 80 according to a further embodiment of the present invention and showing additional details. Clamp 80 comprises substrate 78 (that may be either N or P type or an SOI structure), N type buried layer (NBL) 79 and P-EPI layer 81 of thickness 811 having upper surface 812. PWELL 82 extends into P-EPI layer 81 to depth 821 from surface 812. Abutting or proximate NWELL 84 extends into P-EPI layer 81 to depth 841 from surface 812 and forms PN junction 85 with PWELL 82 or any intervening portion of P-EPI layer 81 that lies laterally between PWELL 82 and NWELL 84. Depth 841 of NWELL 84 (and portion 84' of NWELL 84 at the left of FIG. 5) is desirably substantially equal to thickness 811 of P-EPI layer 81 so that NWELL 84 (and NWELL portion 84') is electrically coupled to NBL 79. However, in other embodiments, one or more separate sinker regions (not shown) may be provided to couple NWELL 84 (and NWELL portion 84') to NBL 79 or NBL 79 may be omitted. NWELL portions 84, 84' may be a single (e.g., wrap-around) NWELL region or separate NWELL regions electrically coupled by NBL 79 or electrically coupled by conductors on or above surface 812. Either arrangement is useful. Located in PWELL 82 is P+ region 86 with conductive contact 861 and N+ region 87 with conductive contact 871. Located in NWELL 84 is P+ region 88 with conductive contact 881 and N+ region 89 with conductive contact 891. N+ (emitter) region 87 with contact 871, PWELL (base) 82 with P+ base contact region 86 and conductive contact 861 and NWELL (collector) region 84 with N+ collector contact region 89 with conductive contact 891 form lateral NPN transistor 90 with lateral base width $L_b(NPN)$ 94. P+ (emitter) region 88 with conductive contact 881, NWELL (base) 84 with N+ base contact region 89 and conductive contact 891 and PWELL (collector) region 82 with P+ collector contact region 86 with conductive contact 861 form lateral PNP transistor 92 with lateral base width $L_b(PNP)$ 96. Base resistor $R_b(NPN)$ 98 is coupled between conductive contact 871 of N+ (emitter) region 87 and conductive contact 861 of P+ base contact region 86 of lateral NPN transistor 90. Base resistor $R_b(PNP)$ 99 is coupled between conductive contact 881 of P+ (emitter) region 88 and conductive contact 891 of N+ base contact region 89 of lateral PNP transistor 92. Regions or elements 81, 82, 84, 85, 86, 87, 88, 89, 90, 92, 94, 96, 98 and 99 of FIG. 6 are analogous to regions or elements 61, 62, 64, 65, 66, 67, 68, 69, 70, 72, 74, 76, 78 and 79 of FIG. 5. Thicknesses and depths 621, 821; 641, 841; 662, 862; 672, 872, etc., of FIGS. 5 and 6 are also analogous. Conductive contacts 661, 861; 671, 871; 681, 881; and 691, 891 of FIGS. 5 and 6 are also analogous. The discussion of these analogous regions, distances and elements in connection with FIG. 5 applies to FIG. 6 and vice versa.

ESD clamp 80 includes further N'WELL region 100 of depth 101 in NWELL 84. N'WELL region 100 has its leftward lateral edge spaced at distance 102 from PN junction 85 between WELL regions 82, 84 (or between NWELL region 84 and any intervening portion (not shown) of P-EPI region 81). Depth 101 of N'WELL region 100 is desirably less than depth 841 of NWELL 84, and is usefully in the range of about 10 to 100 percent of depth 841, more conveniently in the range of about 30 to 80 percent of depth 841 and preferably about 60 percent of depth 841. N'WELL region 100 is desirably about an order of magnitude more heavily doped than NWELL 84. ESD clamp 80 desirably also includes shallow trench isolation (STI) region 93 located to the left of P+ region 86, extending across portion 813 of width 814 of P-EPI region 81 between PWELL region 82 and NWELL region 84' substantially to N+ contact region 89' at the left edge of FIG. 6. STI region 93 is conventionally a dielectric, as for example and not intended to be limiting, a dielectric comprising silicon oxide. N+ region 89' desirably has conductive contact 891' but that may be omitted in other embodiments. STI region 93 may also be omitted in still other embodiments. NWELL region 84' (with or without N+ contact 89') may be internally coupled to NWELL region 84 via NBL 79 or in still further embodiments externally coupled, as for example, via conductor 104 from conductive contact 891' to conductive contact 891 of N+ contact region 89 and/or to I/O 22. Either arrangement is useful.

Figure 7:
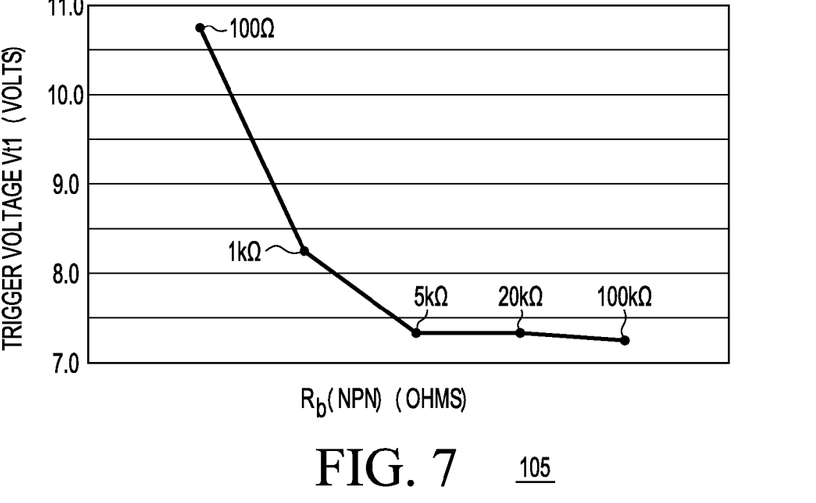
FIG. 7 is a simplified plot of trigger voltage Vt1 of the device of FIG. 6 in volts, as a function of NPN transistor base resistance $R_B$(NPN) in Ohms.

It has been found that by suitably adjusting the values of base resistors $R_b(NPN)$ 78, 98 and $R_b(PNP)$ 79, 99 and base widths $L_b(NPN)$ 74, 94 and $L_b(PNP)$ 76, 96 that Vt1 and Vh can be separately optimized and the reliable operation of ESD clamps 60, 80 greatly improved by lowering Vt1 and increasing Vh. FIG. 7 shows simplified plot 105 of trigger voltage Vt1 of the device of FIG. 6 in volts, as a function of resistance $R_b(NPN)$ in Ohms. In obtaining the data of FIG. 7, $R_b(PNP)$ was constant at substantially zero Ohms (i.e., with a metal or poly short between regions 88(P+) and 89(N+). It will be noted that Vt1 drops from about 10.8 volts with $R_b(NPN)$= 100 Ohms to about 7.3 volts for $R_b(NPN) \geqq 5000$ Ohms. In the range of about 5 k$\Omega \leqq R_b(NPN) \leqq 100$ k$\Omega$ or larger, Vt1 is substantially constant.

Figure 8:
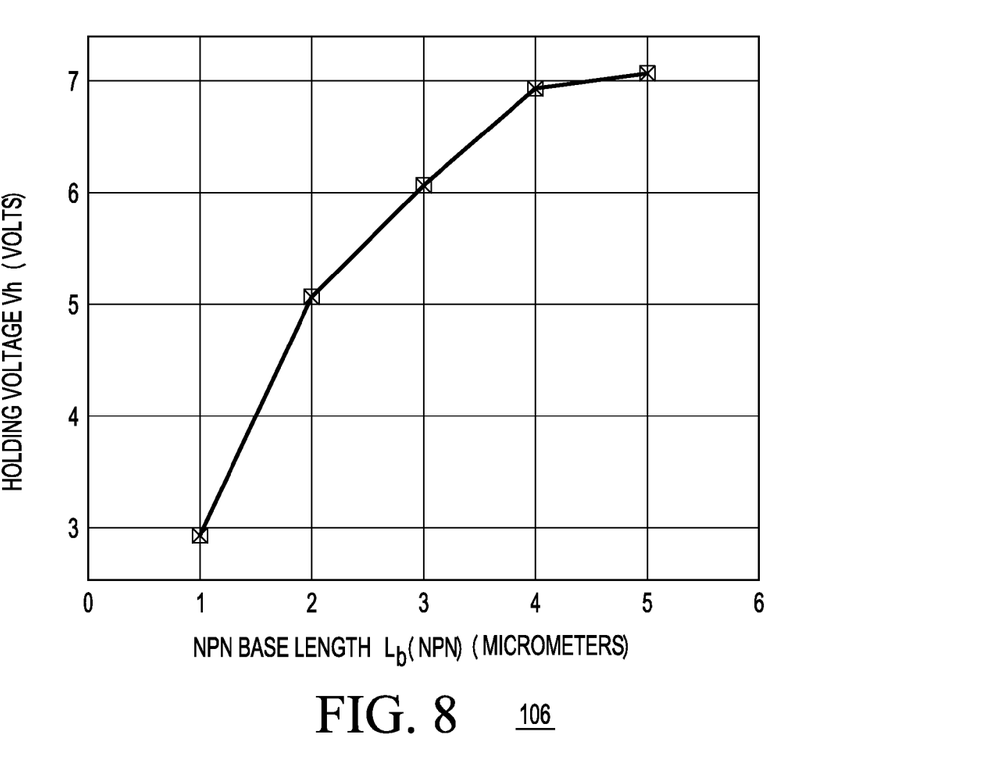
FIG. 8 is a simplified plot of the holding voltage Vh of the device of FIG. 6 in volts as a function of the NPN transistor base length $L_b$(NPN) in micrometers.

FIG. 8 shows simplified plot 106 of the holding voltage Vh of the device of FIG. 6 in volts as a function of the NPN transistor base length $L_b(NPN)$ in micrometers. It will be noted that that Vh is just below 3 volts for $L_b(NPN) \sim 1$ micrometer and rises to just over 7 volts and substantially saturates somewhat above about 7 volts for $L_b(NPN) \sim 5$ micrometers and higher. Thus, by choosing appropriate values of $R_b(NPN)$ and $L_b(NPN)$, trigger voltage Vt1 and holding voltage Vh can be set substantially independently and substantially similar values of Vh and Vt1 obtained.

Figure 9:
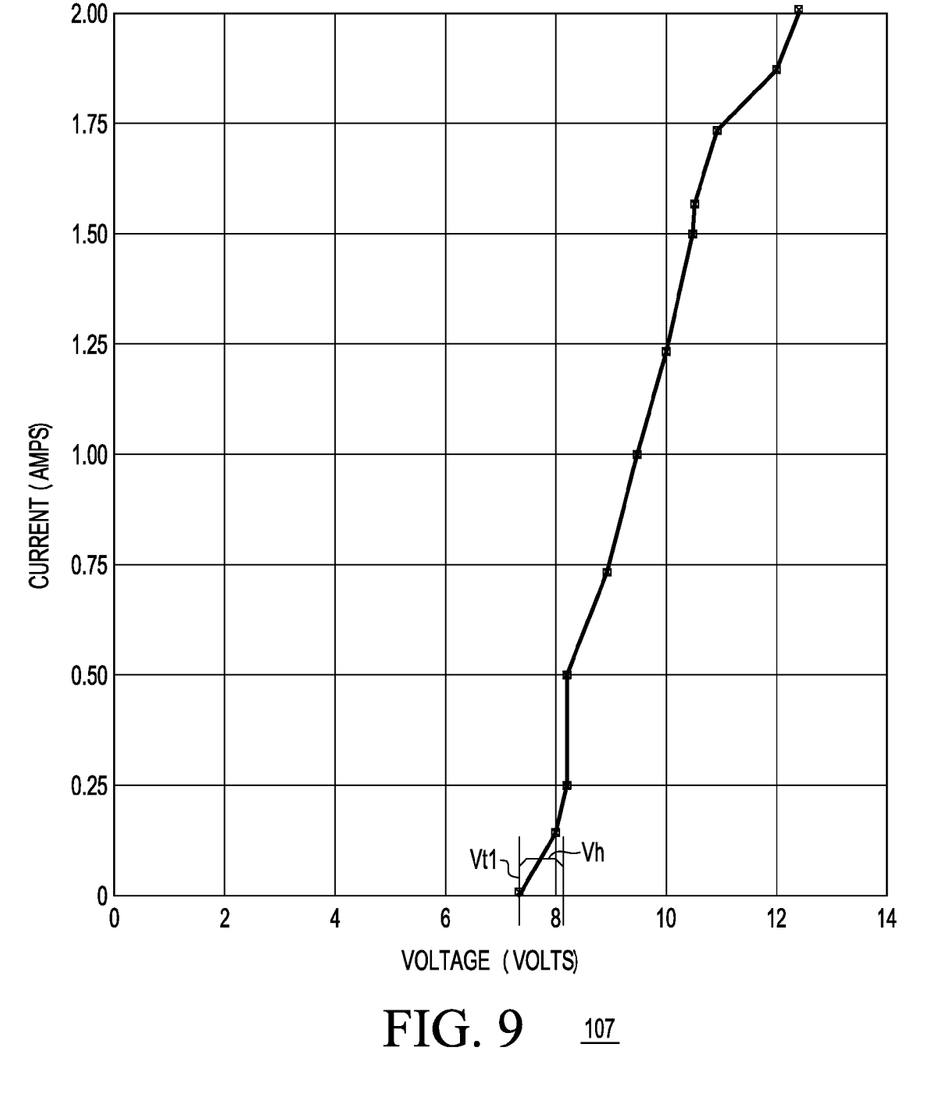
FIG. 9 is a plot of the current (in Amps) versus voltage (in volts) characteristic of the ESD clamps of FIG. 6 with desirable choices of $R_B(NPN)$ and $L_b(NPN)$.

FIG. 9 shows plot 107 of the current (in Amps) versus voltage (in volts) characteristic of the ESD clamps of FIGS. 5 and 6 with desirable choices of $R_B(NPN)$ and $L_b(NPN)$. In this instance, $R_b(NPN)$ was about 20 kiloOhms and $L_b(NPN)$ was about 0.9 micrometers and $R_b(PNP)$ was substantially zero Ohms and $L_b(PNP)$ was about 1.1 micrometers. It will be noted that Vt1 and Vh have substantially similar values, in the range of about 7.6±0.5 volts. It has been found that ESD clamps 60, 80 with Vt1 and Vh values that are substantially similar, are very effective in ESD protection application with narrow design windows, as for example, where the operating voltage is close to the degradation voltage. The desirable behavior exhibited in FIG. 9 may be obtained using the arrangement of either FIG. 5 or 6, provided that appropriate values of $R_b(NPN)$ and $R_b(PNP)$ and appropriate values of $L_b(NPN)$ and $L_b(PNP)$ are chosen. It is desirable that $R_b(NPN)$ is at least between 1 kiloOhm and 1 megaOhm, more conveniently, between 5 kiloOhms and 100 kiloOhms and preferable between 10 kiloOhms and 40 kiloOhms. It is desirable that $L_b(NPN)$ and $L_b(PNP)$ have values: (i) for $L_b(NPN)$ generally in the range of $0.1 \leqq L_b(NPN) \leqq 10$ micrometers, more conveniently in the range of about $0.4 \leqq L_b(NPN) \leqq 5$ micrometers and preferably in the range of about $0.8 \leqq L_b(NPN) \leqq 3$ micrometers, and (ii) for $L_b(PNP)$ generally in the range of $0.1 \leqq L_b(PNP) \leqq 10$ micrometers, more conveniently in the range of about $0.4 \leqq L_b(PNP) \leqq 5$ micrometers and preferably in the range of about $0.8 \leqq L_b(PNP) \leqq 3$ micrometers, but other values may also be used.

FIGS. 10-20 are simplified cross-sectional views of the ESD clamp of FIG. 6 at various stages of manufacture 210-220 providing structures 310-320, illustrating a preferred manufacturing process according to still further embodiments of the invention. In describing the formation of the various doped regions in device 80, ion implantation using photo-resist masks is the preferred method of doping, but persons of skill in the art will understand that the present invention is not limited merely to methods employing ion implantation or devices formed using ion implantation. Any doping means may be used to obtain the described embodiments and any mask materials consistent with the selected doping means may also be employed. Accordingly, the doping methods illustrated herein are meant to illustrate preferred embodiments and not be limiting.

Figure 10:
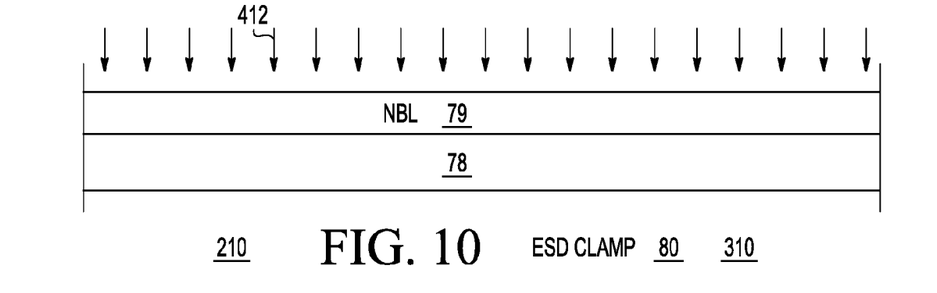
FIGS. 10-20 are simplified cross-sectional views of the ESD clamp of FIG. 6 at various stages of manufacture, illustrating a preferred manufacturing process according to still further embodiments of the invention.
Figure 11:
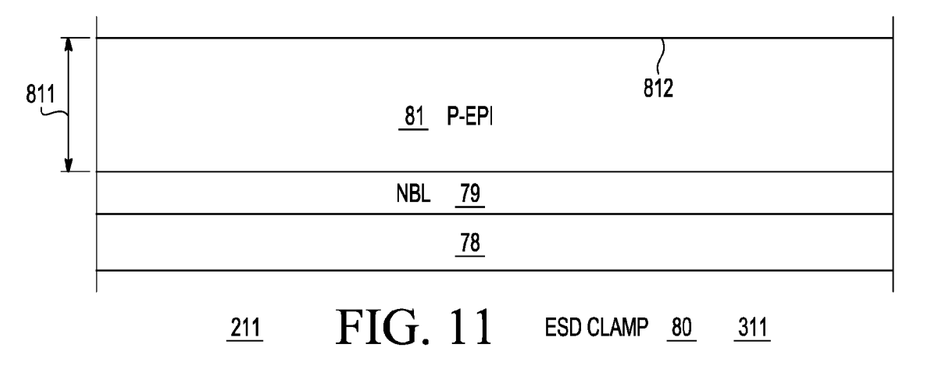
Figure 12:
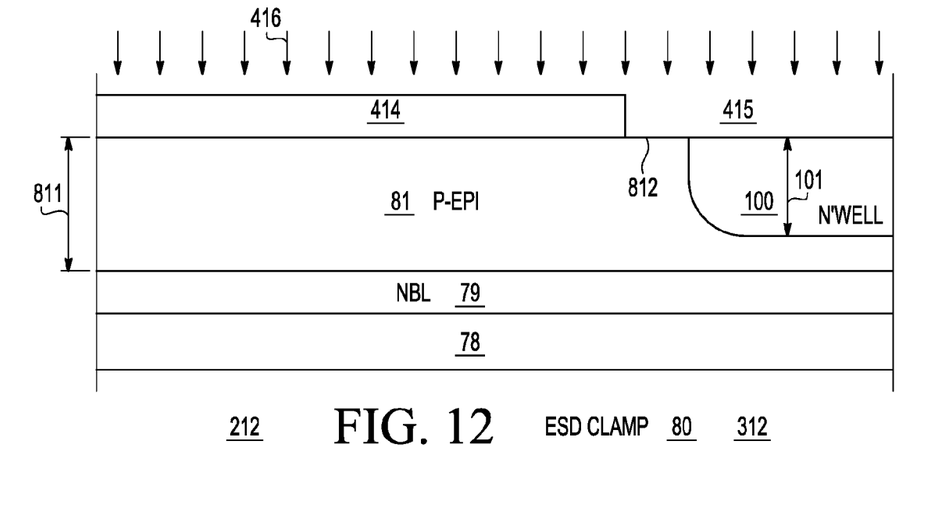

Referring now to manufacturing stage 210 of FIG. 10, substrate 78 is provided in which conventional buried layer region 79 is provided, preferably formed by ion implant 412.

In a preferred embodiment, substrate 78 is P type with a doping concentration within about an order of magnitude of 1E15 cm$^{-3}$, but higher and lower doping can also be used and SOI structures can also be used. Buried layer 79 is preferably N type with a doping concentration of about 1E19 cm$^{-3}$, but higher or lower doping concentrations can also be used. For convenience of description layer 79 is referred to as "NBL 79", but this not intended to be limiting and the choice of doping for buried layer 79 will depend upon the particular devices being formed by the user. Structure 310 results. Referring now to manufacturing stage 211 of FIG. 11, epitaxial layer 81 of thickness 811 with upper surface 812 is desirably formed over NBL 79. In a preferred embodiment, epi-layer 81 is desirably P type with a dopant concentration within an order of magnitude of about 1E15 cm$^{-3}$, wherein 1E15 cm$^{-3}$ is a preferred central value, but higher or lower concentrations and other doping can also be used. Thickness 811 is usefully in the range of about 0.5 to 20 micrometers, more conveniently in the range of about 1.5 to 3 micrometers and preferably about 2 micrometers, but larger or smaller values can also be used. Structure 311 results. Referring now to manufacturing stage 212 of FIG. 12, mask 414 is applied to surface 812 of P Epi-layer 81, having opening 415 toward the right side of structure 311. Ion implant 416 is preferably used in conjunction with opening 415 to form doped region 100 of depth 101 from surface 812, referred to hereafter as N'WELL 100. Depth 101 is usefully in the range of about 0.05 to 21 micrometers, more conveniently in the range of about 0.45 to 3.2 micrometers and preferably about 1.8 micrometers, but larger or smaller values can also be used. In a preferred embodiment, N'WELL 100 has doping concentration at surface 812 of about 1E19 cm$^{-3}$, tapering off with depth to about 1E15 cm$^{-3}$, at a depth of about 1.6 to 2.0 micrometers, but shallower or steeper doping profiles may also be used. Structure 312 results.

Figure 13:
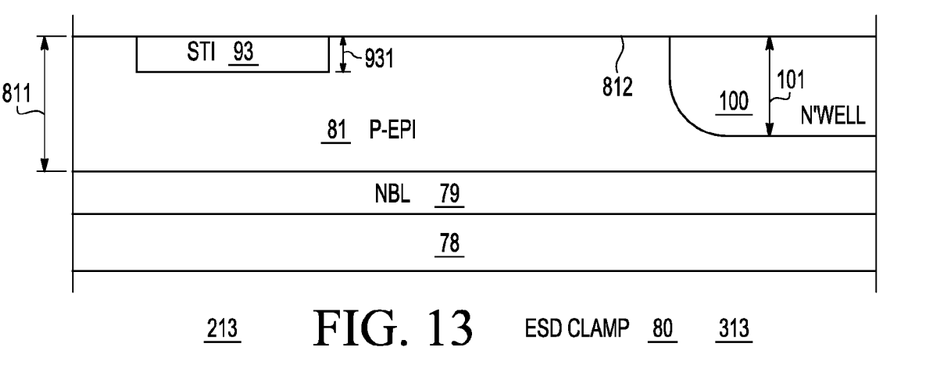
Figure 14:
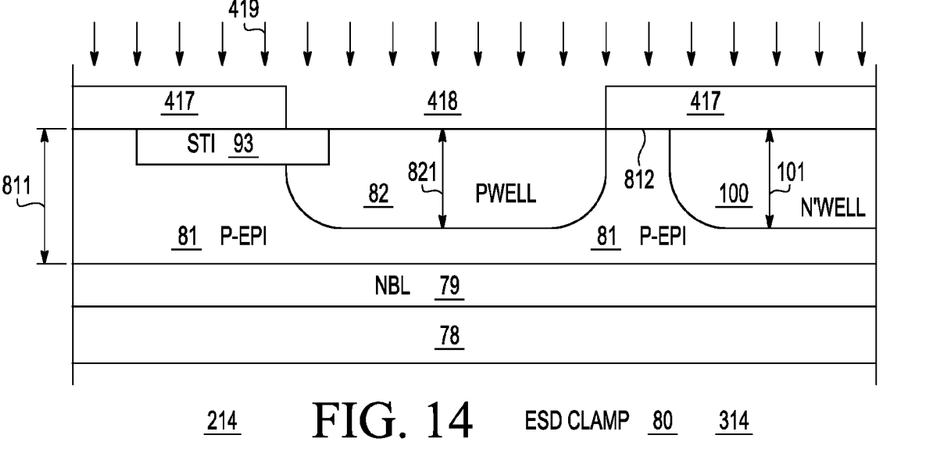

Referring now to manufacturing stage 213 of FIG. 13, mask 414 is removed and shallow trench isolation (STI) region 93 toward the left in structure 212 is formed in a conventional manner, for example and not intended to be limiting, by etching a trench into P-EPI layer 81, filling the trench with a dielectric (e.g., silicon oxide or silicon nitride or combinations thereof) and then planarizing the structure so as to provide substantially planar STI region 93 whose surface is substantially coincident with surface 812 of P-epi layer 81. STI region 93 has depth 931 from surface 812 usefully in the range of about 0.1 to 4 micrometers, more conveniently in the range of about 0.3 to 0.6 micrometers and preferably about 0.4 micrometers, but larger or smaller values can also be used. Means and methods for forming such STI regions are well known in the art and any of such known methods may be employed. Structure 313 results. Referring now to manufacturing stage 214 of FIG. 14, mask 417 having opening 418 is provided on surface 812 of Epi-layer 81, wherein opening 418 desirably extends partly onto STI region 93 and is spaced apart from N'WELL 100. In other embodiments, this overlap onto STI region 93 may be omitted. Implant 419 is preferably used to form PWELL 82 of depth 821 from surface 812 in opening 418. PWELL 82 has a surface dopant concentration of about 1E17 cm$^{-3}$ PWELL 82 desirably has a peak concentration in the range of about 0.2-1.2E18 cm$^{-3}$, more conveniently about 0.5-1.0E18 cm$^{-3}$ and preferably about 0.8-1.0E18 cm$^{-3}$ at about a depth below surface 812 of about 0.3 to 2.0 micrometers, more conveniently about 0.5 to 1.7 micrometers and preferably about 0.6 to 1.5 micrometers, but other values can also be used. Boron is a suitable dopant for use with silicon. Structure 314 results.

Figure 15:
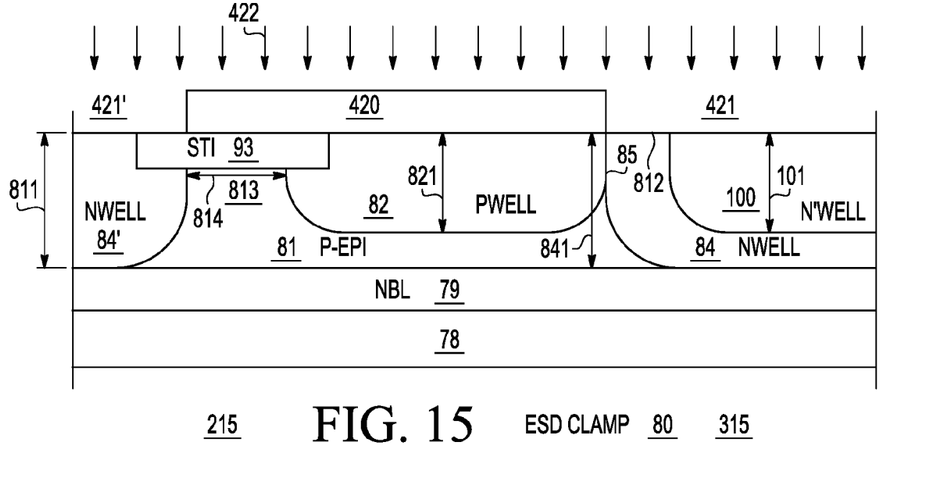

Referring now to manufacturing stage 215 of FIG. 15, mask 417 is removed and replaced by mask 420 having opening(s) 421, 421'. Opening(s) 421, 421' may be a single, e.g., annular, opening or may comprise separated openings. Either arrangement is useful. Ion implant 422, of for example, phosphorous is provided through openings 421, 421' to form NWELL region 84, 84' of depth 841 desirably generally similar to thickness 811 of P-Epi layer 81 so that NWELL 84, 84' is electrically coupled to NBL 79, although in other embodiments, such connection may be provided by other means. NWELL region 84, 84' has a near surface concentration of about 1E17-1E18 cm$^{-3}$ NWELL region 84, 84' has a peak concentration usefully in the range of about 0.2-5E18 cm$^{-3}$, more conveniently in the range of about 0.5-2E18 cm$^{-3}$ and preferably about 1E18 cm$^{-3}$, at a depth below surface 812 in the range of about 0.5-2.0 micrometers, more conveniently in the range of about 0.7-1.5 micrometers and preferably about 0.8-1.0 micrometers. Or stated another way, depth 841 of NWELL 84 is usefully in the range of about 0.5 to 21 micrometers, more conveniently in the range of about 1.5 to 4 micrometers and preferably about 3 micrometers, but larger or smaller values can also be used. Structure 315 results. A consequence of the combination of doping steps in manufacturing stages 212 and 215 is that N'WELL 100 is more heavily doped than NWELL 84.

Figure 16:
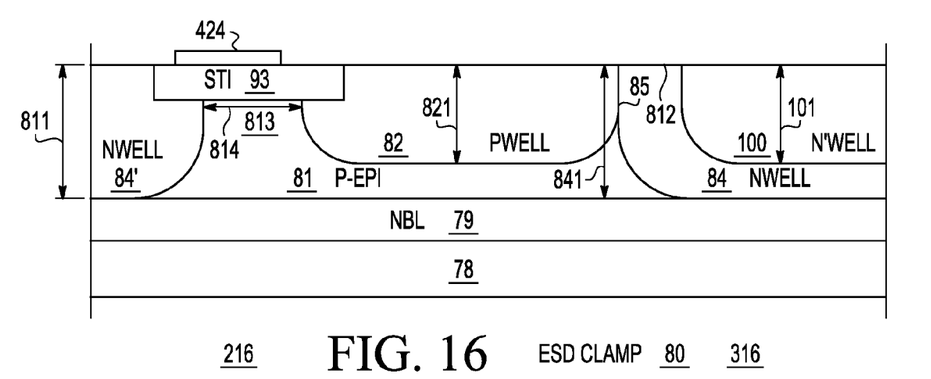

Referring now to manufacturing stage 216 of FIG. 16, resistive region 424 is provided on STI 93. Resistive region 424 is subsequently used to form resistor $R_b$(NPN) 98 of FIG. 6 and the sheet resistance of region 424 is chosen depending upon the magnitude of resistance $R_b$(NPN) 98 desired by the user. Polycrystalline silicon is an example of a suitable material for resistive region 424 but other thin film resistance materials may also be used. Such materials are well known in the art. By placing resistive region 424 atop STI region 93, electrical coupling to underlying portions of SC P-Epi layer 81 and substrate 78 is negligible. While it is preferred to form resistor $R_b$(NPN) 98 using resistive region 424, this is not intended to be limiting and in other embodiments, any type of resistance may be used for $R_b$(NPN) 98, including but not limited to doped regions located within or on substrate 78 and associated SC layers or regions or thin film resistance materials of any type, provided that the resulting resistance is sufficiently isolated from the remainder of device 60, 80 so as to be able to act electrically in the desired manner. The lateral size of resistive region 424 will be selected by the user depending upon the desired finished resistance, the available sheet resistance of the material making up region 424 and any design rule limitations on electrical connections thereto. Such design choices and the deposition and masking techniques associated therewith are well understood in the art. Structure 316 results. While only one STI region 93 and one resistive region 424 used to form $R_b$(NPN) are shown in FIGS. 10-20 and, persons of skill in the art will understand that further resistive regions on the same or other STI regions may also be provided so as to implement $R_b$(PNP) where substantially non-zero values are desired for $R_b$(PNP).

Figure 17:
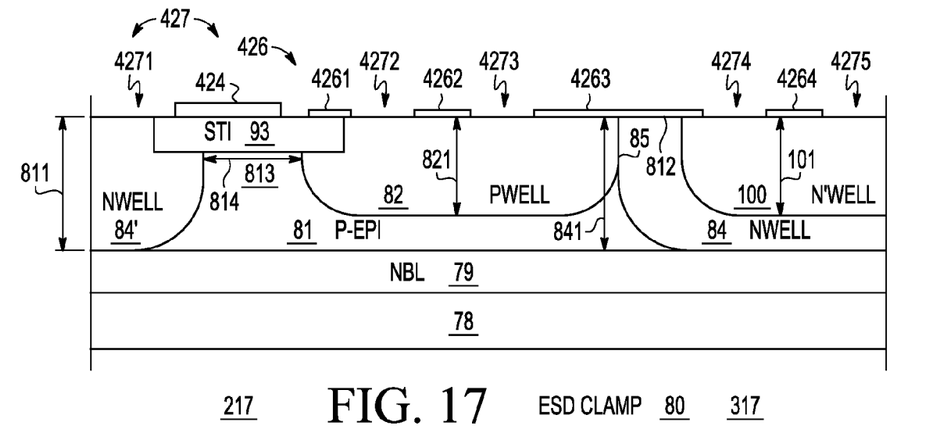

Referring now to manufacturing stage 217 of FIG. 17, silicide blocking layer 426 is deposited and patterned on SC surface 812. Where surface 812 comprises silicon, blocking layer 426 is desirably formed of a silicon oxide first layer in contact with SC surface 812 followed by a silicon nitride second layer, thereby forming composite silicide blocking layer 426. The thickness is chosen so as to be substantially impervious to ion implantation being used in subsequent steps to form regions 66, 86, 67, 87, 68, 88, 69, 89, 89' (see FIGS. 5-6) where layer 426 also acts in part as an implant mask. In the embodiment shown, layer 426, comprises spaced-apart portions 4261, 4262, 4263, and 4264 with openings 4271, 4272, 4273, 4274, 4275 therein (collectively 427). The locations and spacing of these various parts of layer 426 and openings 427 are chosen so that the location, width and spacing of N+ regions 87, 89. 89' and P+ regions 86, 88 (see FIGS. 6 and 19-20) are determined by layer 426, which acts as a single self-aligned mask. In this way, the location, width and spacing of N+ regions 87, 89, 89' and P+ regions 86, 88 do not depend upon high precision alignment of various subsequent implant or other dopant blocking masks. Since such N+ and P+ regions can be generally quite shallow (e.g., about $\leq 0.5$ micrometers) silicide blocking layer 426 can be relatively thin since, in the preferred embodiment, the implants used to form such N+ and P+ regions are of comparatively low energy and have limited penetrating power. If higher energy and deeper penetration are desired or if other doping means are utilized to form such N+ and P+ regions, then the thickness of layer 426 is adjusted accordingly. Such adjustments are within the competence of those of skill in the art. Structure 317 results.

Figure 18:
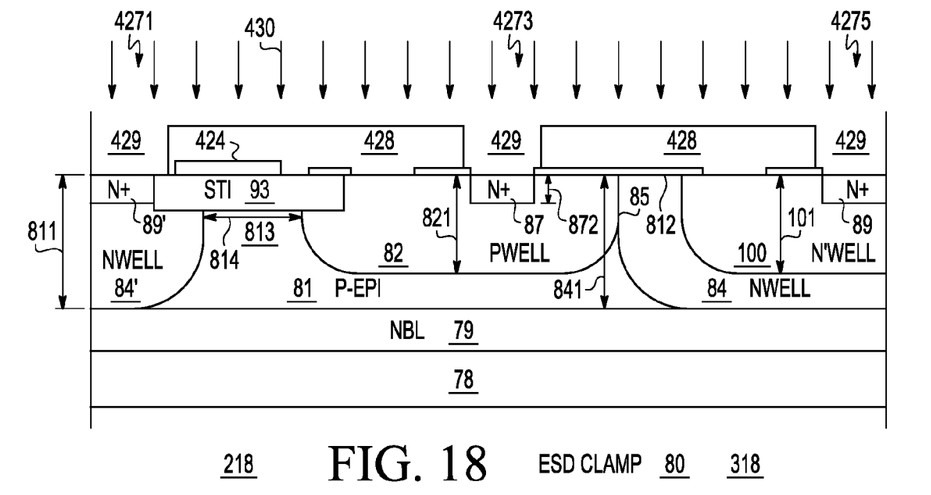
Figure 19:
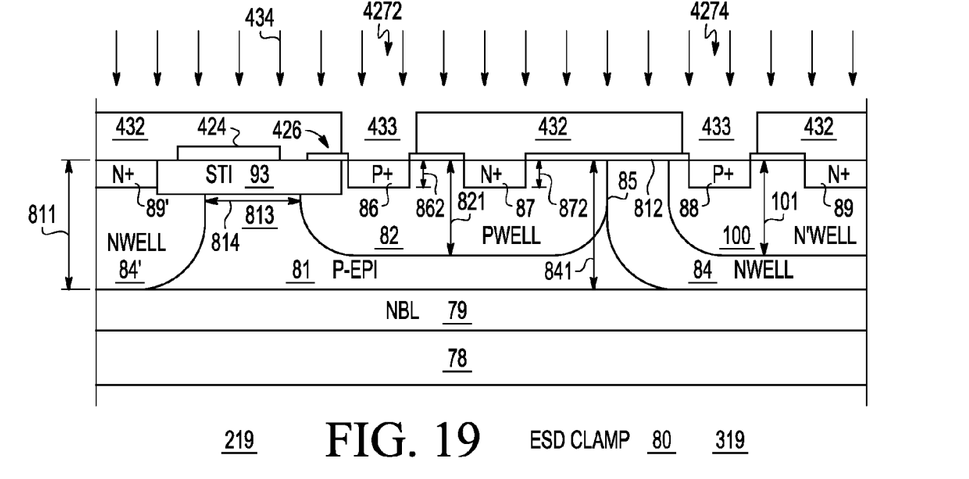

Referring now to manufacturing stage 218 of FIG. 18, first selector mask 428 having openings 429 is applied over structure 317. Openings 4271, 4273, 4275 in layer 426 are exposed in openings 429 of mask 428. N+ regions 87, 89, 89' are desirably formed by N type implant 430 to depth 872, as desired by the device designer, where precision of the location, width and spacing of such N+ regions is determined by layer 426. Structure 318 results. Referring now to manufacturing stage 219 of FIG. 19, mask 428 is removed and second selector mask 432 having openings 433 is applied over structure 317. Openings 4272 and 4274 in layer 426 are exposed in openings 433 of mask 432. P+ regions 86 and 88 are desirably formed by P type implant 434 to depth 862, as desired by the device designer, where the precision of location, width and spacing of such P+ regions is determined by layer 426. Structure 319 results.

Figure 20:
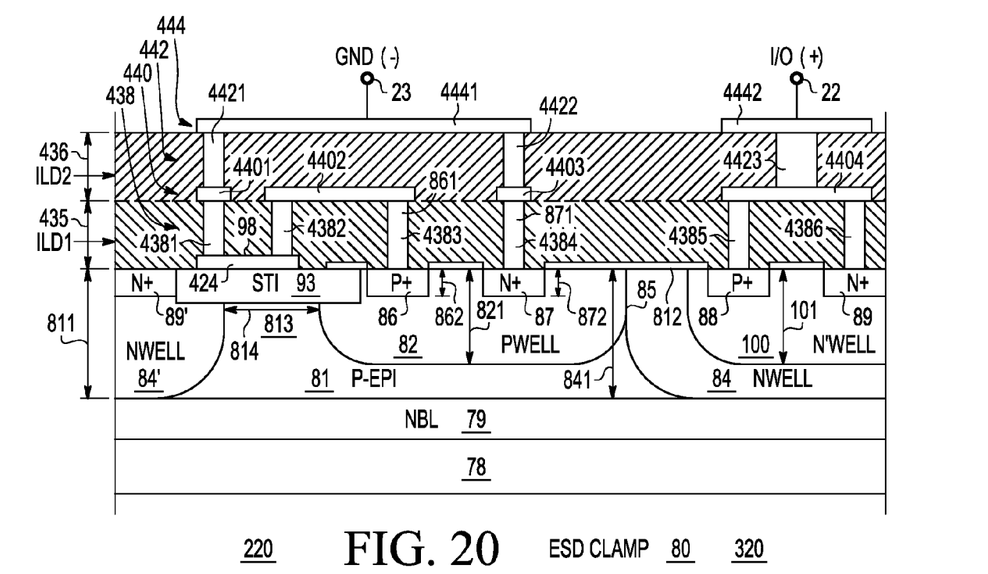

Referring now to manufacturing stage 220 of FIG. 20, various conductive (e.g. metal or semimetal) vias and layers 438, 440, 442 and 444 with intervening insulating dielectric layer IDL1 of thickness 435 and intervening insulating dielectric layer IDL2 of thickness 436 are provided over surface 812 and layer 426 to accomplish the connections to the various N+, P+ regions and to resistive region 424 as described in connection with FIGS. 5 and 6. Suitable values for the thicknesses of and choice of materials for IDL1, IDL2 and vias and conductors 438-444 are within the competence of those of skill in the art and will depend on the particular process capabilities available in the manufacturing line being used to fabricate devices 60, 80. Conductor (e.g., metal or semi-metal or doped poly) layer 440 is customarily referred to as "metal-1" and conductor (e.g., metal or semi-metal or doped poly) layer 444 is customarily referred to as "metal-2". Referring now to both FIGS. 6 and 20: (i) individual conductive vias 4381, 4382 provide Ohmic electrical connections to resistive region 424 so as to form resistor 98, and (ii) individual conductive via 4383 corresponds to connection 861, via 4384 corresponds to connection 871, via 4385 corresponds to connection 881 and via 4386 corresponds to connection 891 (connection 891 ' is omitted in FIG. 20 to avoid unduly cluttering the drawing). Portion 4402 of metal-1 conductor layer 440 connects vias 4382 and 4383 so as to couple one end of resistor 98 to contact 861 of P+ region 86. Portion 4404 of metal-1 conductor layer 440 connects vias 4385, 881 and 4386, 891 so as to Ohmically couple P+ region 88 and N+ region 89 with a substantially low resistance connection. Via portion 4421 (with portion 4401 of metal-1) couples a second end of resistor 98 to metal-2 layer portion 4441 which is in turn coupled through via portion 4422, portion 4403 of metal-1 layer 440 and via portion 4384 to N+ region 87, as seen schematically in FIG. 6. Metal-2 layer portion 4441 is coupled to GND 23. Via portion 4423 couples metal-1 layer portion 4404 to metal-2 layer portion 4442 which is, in turn, coupled to I/O 22. Structure 320 results. Structure 320 provides the various N and P regions and accomplishes the electrical connections illustrated schematically in FIGS. 5 and 6.

According to a first embodiment, there is provided an electronic device (10) having a first terminal (22) and a second terminal (23), comprising, a circuit core (24) coupled between the first terminal (22) and the second terminal (23), and at least one voltage limiting device (11, 60, 80) coupled between the first terminal (22) and the second terminal (23), wherein the voltage limiting device (11, 60, 80) comprises, a first bipolar transistor (70, 90) having an emitter (67, 87) of a first conductivity type, a first base (62, 82) of a second opposite conductivity type and of first base width (74, 94), and a first collector (64, 84) of the first conductivity type, and a second bipolar transistor (72, 92) having a second emitter (68, 88) of the second conductivity type, a second base (64, 84) of the first conductivity type and second base width (76, 96), and a second collector (62, 82) of the second conductivity type, a first base resistance (78, 98) coupled between the first emitter (67, 87) and the first base (62, 82), a second base resistance (79, 99) coupled between the second emitter (68, 88) and the second base (64, 84), and wherein a PN junction (65, 85) exits between the first base (62, 82) and the second base (64, 84), and wherein the first emitter (67, 87) is coupled to the second terminal (23) and the second emitter (68, 88) is coupled to the first terminal (22). According to a further embodiment, the first base resistance (78, 98) is equal or greater than about 5000 Ohms. According to a still further embodiment, the second base resistance (79, 99) is substantially a short circuit. According to a yet further embodiment, the second base (64, 84) comprises a further region (100) having a doping density higher than a remainder of the second base (64, 84). According to a still yet further embodiment, the first base (62, 82) also serves as the second collector (62, 82) and the second base (64, 84) also serves as the first collector (64, 84). According to a still yet further embodiment, a trigger voltage Vtl and a holding voltage Vh of the voltage limiting device (11, 60, 80) are substantially similar. According to another embodiment, at least one of the first base resistance (78, 98) and the second base resistance (79, 99) is a deposited material. According to a still another embodiment, at least one of the first base resistance (78, 98) and the second base resistance (79, 99) comprises a semiconductor.

According to a second embodiment, an electronic device (10) having a voltage limiting device (11, 60, 80) coupled between an input/output (I/O) terminal (22) and a common terminal (23) of the electronic device (10), comprises, a first bipolar transistor (70, 90) having an emitter (67, 87) of a first conductivity type, a base (62, 82) of first base width (74, 94) and of a second, opposite conductivity type with a more heavily doped contact region (66, 86) of the second conductivity type, and a collector (64, 84) of the first conductivity type with a more heavily doped contact region (69, 89) of the first conductivity type, and a second bipolar (72, 92) transistor partially merged with the first bipolar transistor and having an emitter (68, 88) of the second conductivity type, a base (64, 84) of second base width (76, 94) and of the first conductivity type with a more heavily doped contact region (69, 89) of the first conductivity type, and a collector (62, 82) of the second conductivity type with a more heavily doped contact region (66, 86) of the second conductivity type, a first base resistance (78, 98) coupled between the emitter (67, 87) and the base contact (66, 86) of the first transistor (70, 90), a second base resistance (79, 99) coupled between the emitter (68, 88) and the base contact (69, 89) of the second transistor (72, 92) and wherein a PN junction (65, 85) exits between the base (62, 82) of the first transistor (70, 90) and the base (64, 84) of the second transistor (72, 92), and wherein one of the emitter (67, 87) of the first transistor (70, 90) or the emitter (68, 88) of the second transistor (72, 92) is coupled to the common terminal (23) and another of the emitter (67, 87) of the first transistor (70, 90) or the emitter (68, 88) of the second transistor (72, 92) is coupled to the I/O terminal (22). According to a further embodiment, the base (62, 82) of the first transistor (70, 90) and the collector (62, 82) of second transistor (72, 92) are merged. According to a still further embodiment, the base (64, 84) of the second transistor (72, 92) and the collector (64, 84) of first transistor (70, 90) are merged. According to a yet further embodiment, the base (62, 82) of the first transistor (70, 90) and the collector (62, 82) of second transistor are of the same conductivity type. According to a still yet further embodiment, the base (64, 84) of the second transistor (72, 92) and the collector (64, 84) of first transistor (70, 90) are of the same conductivity type. According to a yet still further embodiment, the second base resistance (79, 99) is much smaller than the first base resistance (78, 98).

According to a third embodiment, there is provided method of forming a voltage limiting device (11, 60, 80), comprising, providing a substrate having a first semiconductor region (61, 81) of a first conductivity type extending to a first surface (612, 812), forming a first well region (62, 82) of the first conductivity type in the first region (61, 81) and extending to a first depth (621, 821) from the first surface (612, 812), forming a second well region (64, 84, 84') of a second, opposite, conductivity type in the first region and extending to a second depth (641, 841) from the first surface (612, 812), wherein the first (62, 82) and second (64, 84) well regions are on opposite sides of a PN junction (65, 85) located therebetween; and wherein the first well region (62, 82) is adapted to function as a base of a first bipolar transistor (70, 90) of a first kind and as a collector of a second bipolar transistor (72, 92) of a second, opposite, kind, and the second well region (64, 84) is adapted to function as a base of the second transistor (72, 92) and as a collector of the first transistor (70, 90), providing a first more highly doped region (67, 87) of the second conductivity type in the first well region (62, 82) and a second more highly doped region (69, 89) of the second conductivity type in the second well region (64, 84), wherein the first more highly doped region (67, 87) is adapted to function as an emitter of the first bipolar transistor (70, 90) and the second more highly doped region (69, 89) is adapted to serve as a collector contact of the first transistor (70, 90), providing a third more highly doped region (68, 88) of the first conductivity type in the second well region (64, 84) and a fourth more highly doped region (66, 86) of the first conductivity type in the first well region (62, 82), wherein the third more highly doped region (68, 88) is adapted to function as an emitter of the second bipolar transistor (72, 92) and the fourth more highly doped region (66, 86) is adapted to serve as a collector contact of the second transistor (72, 92), forming a first resistance (78, 98) electrically coupled between the second more highly doped region (67, 87) and the fourth more highly doped region (66, 86), and forming a second resistance (79, 99) coupled between the third more highly doped region (68, 88) and the second more highly doped region (69, 89). According to a further embodiment, the steps of providing the more highly doped regions (67, 87; 69, 89; 68, 88; and 66, 86) use a common spacing determining mask (426). According to a still further embodiment, the method further comprises providing a further well region (100) of a third depth (101) within the second well region (64, 84). According to a yet further embodiment, the third depth (101) of the further well region (100) is less than the second depth (841) of the second well region (84). According to a still yet further embodiment, the further well region (100) is more heavily doped than the second well region (84). According to a yet still further embodiment, the method further comprises forming a buried layer (79) of the second conductivity type underlying the first (82) and second (84) well regions and electrically coupled to the second well region (84).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic device having a first terminal and a second terminal, comprising:
   a circuit core coupled between the first terminal and the second terminal; and
   at least one voltage limiting device coupled between the first terminal and the second terminal, wherein the voltage limiting device comprises:
      a first bipolar transistor having an emitter of a first conductivity type, a first base of a second opposite conductivity type and a first base width, and a first collector of the first conductivity type; and
      a second bipolar transistor having a second emitter of the second conductivity type, a first portion of a second base of the first conductivity type and having a second base width and a first doping density, a further portion of the second base within the first portion of the second base and having the first conductivity type and a second doping density higher than the first doping density, and a second collector of the second conductivity type;
      a first base resistance coupled between the first emitter and the first base;
      a second base resistance coupled between the second emitter and the second base; and
      wherein a PN junction exits between the first base and the second base; and
      wherein the first emitter is coupled to the second terminal and the second emitter is coupled to the first terminal.

2. The device of claim 1, wherein the first base resistance is equal or greater than about 5000 Ohms.

3. The device of claim 1, wherein the second base resistance is substantially a short circuit.

4. An electronic device having a first terminal and a second terminal, comprising:
   a circuit core coupled between the first terminal and the second terminal; and
   at least one voltage limiting device coupled between the first terminal and the second terminal, wherein the voltage limiting device comprises:

a first bipolar transistor having an emitter of a first conductivity type, a first base of a second opposite conductivity type and of first base width, and a first collector of the first conductivity type; and a second bipolar transistor having a second emitter of the second conductivity type, a second base of the first conductivity type and second base width, and a second collector of the second conductivity type, wherein the second base comprises a further region having a doping density higher than a remainder of the second base;

a first base resistance coupled between the first emitter and the first base;

a second base resistance coupled between the second emitter and the second base; and wherein a PN junction exits between the first base and the second base; and wherein the first emitter is coupled to the second terminal and the second emitter is coupled to the first terminal.

5. The device of claim 4, wherein the first base also serves as the second collector and the second base also serves as the first collector.

6. The device of claim 4, wherein a trigger voltage Vt1 and a holding voltage Vh of the voltage limiting device are substantially similar.

7. The device of claim 4, wherein at least one of the first base resistance and the second base resistance is a deposited material.

8. The device of claim 4, wherein at least one of the first base resistance and the second base resistance comprises a semiconductor.

9. The device of claim 4, wherein the second bipolar transistor is partially merged with the first bipolar transistor.

10. The device of claim 9, wherein the first base and the second collector are merged.

11. The device of claim 9, wherein the second base and the first collector are merged.

12. The device of claim 4, wherein a resistance of the second base is much smaller than a resistance of the first base.

13. The device of claim 4, wherein the first base has a more heavily doped contact region of the second conductivity type.

14. The device of claim 4, wherein the first collector has a more heavily doped contact region of the first conductivity type.

15. The device of claim 4, wherein the second base has a more heavily doped contact region of the first conductivity type.

16. The device of claim 4, wherein the second collector has a more heavily doped contact region of the second conductivity type.

* * * * *